United States Patent [19]
Meissner et al.

[11] Patent Number: 5,852,622
[45] Date of Patent: Dec. 22, 1998

[54] SOLID STATE LASERS WITH COMPOSITE CRYSTAL OR GLASS COMPONENTS

[75] Inventors: Helmuth E. Meissner; Oliver R. Meissner, both of Pleasanton, Calif.

[73] Assignee: Onyx Optics, Inc., Dublin, Calif.

[21] Appl. No.: 713,436

[22] Filed: Sep. 11, 1996

Related U.S. Application Data

[63] Continuation-in-part of Ser. No. 339,147, Nov. 14, 1994, Pat. No. 5,563,899, which is a continuation-in-part of Ser. No. 330,174, Oct. 27, 1994, abandoned, which is a division of Ser. No. 919,374, Jul. 29, 1992, Pat. No. 5,441,803, which is a continuation of Ser. No. 672,251, Mar. 20, 1991, abandoned, which is a continuation-in-part of Ser. No. 597,987, Oct. 15, 1990, abandoned, which is a continuation of Ser. No. 446,214, Dec. 5, 1989, abandoned, which is a division of Ser. No. 238,563, Aug. 30, 1988, abandoned.

[51] Int. Cl.$^6$ ........................................................ H01S 3/14
[52] U.S. Cl. ................................................ 372/39; 372/41
[58] Field of Search .......................... 378/92, 39; 372/66, 372/41, 68

[56] References Cited

U.S. PATENT DOCUMENTS

| | | |
|---|---|---|
| 3,565,508 | 2/1971 | DuMont . |
| 3,590,004 | 6/1971 | Woodcock ................................ 372/68 |
| 3,675,155 | 7/1972 | Landry et al. . |
| 3,755,757 | 8/1973 | Woodcock . |
| 3,880,632 | 4/1975 | Podvigalkina . |
| 3,963,347 | 6/1976 | Segre et al. . |
| 3,978,427 | 8/1976 | Truscott . |
| 4,149,902 | 4/1979 | Mauer et al. . |
| 4,507,787 | 3/1985 | Daly et al. ................................ 372/66 |
| 4,509,175 | 4/1985 | Daly et al. . |
| 4,531,809 | 7/1985 | Carter et al. . |
| 4,638,552 | 1/1987 | Shimbo et al. . |
| 4,810,318 | 3/1989 | Haisma et al. . |
| 4,984,246 | 1/1991 | Cabaret et al. . |
| 5,033,058 | 7/1991 | Cabaret et al. . |
| 5,084,888 | 1/1992 | Tajima et al. . |
| 5,239,549 | 8/1993 | Tajima et al. . |
| 5,321,711 | 6/1994 | Rapoport et al. ........................ 372/41 |
| 5,394,420 | 2/1995 | Senhn et al. ............................. 372/66 |
| 5,548,606 | 8/1996 | Senn et al. ............................... 372/41 |

FOREIGN PATENT DOCUMENTS

| | | |
|---|---|---|
| 0136050 | 5/1984 | European Pat. Off. . |
| 0232935 | 1/1987 | European Pat. Off. . |

OTHER PUBLICATIONS

H. C. Lee, et al., Single Crystal Composites for EO Applications, Optics in Montana '91: Topical Meeting on CTH:YAG. vol. 1. Aug. 13–15, 1991. 12 pgs.

Onyx Optics. Design Features and Applications of ONYX OPTICS' Crystal Composites (A product description). Released May 1994. 3 pgs.

H. F. Fischmeister, et al. Preparation, Properties and Structure of Metal/Oxide Interfaces. Mat. Res. Soc. Symp. Proc. vol. 122, 1988. pp. 529–540. (No month).

Hidemi Tajima, et al. Performance of Composite Glass Slab Laser. IEEE J. of Quantum Electronics. vol. 28, No. 6, Jun. 1992. pp. 1562–1570.

C. T. Yen, et al., On Controlled Solidification Studies of Some $TiO_2$ Binary Alloys. J. Mater. Res. vol. 7, No. 4, Apr. 1992. pp. 980–991.

R. B. Chesler. A Stabilizing Sleeve for the Nd:YAIG Laser. Applied Optics. vol. 9, No. 9, Sep. 1970. pp. 2190–2191.

(List continued on next page.)

*Primary Examiner*—Rodney Bovernick
*Assistant Examiner*—Robert E. Wise
*Attorney, Agent, or Firm*—David G. Beck; Townsend and Townsend and Crew

[57] ABSTRACT

A system for improving the thermal uniformity, beam quality and lasing efficiency of composite solid state lasers by reducing parasitic oscillations and confining the laserable medium to a location in the composite laser component where it is most efficient is provided. The improvements are accomplished by bonding one or more laser-inactive or laser-radiation-absorbing layers to a laserable medium.

11 Claims, 3 Drawing Sheets

OTHER PUBLICATIONS

J. McKenna. The Focusing of Light by a Dielectric Rod. Applied Optics. vol. 2, No. 3, Mar. 1963, pp. 303–310.

G. E. Devlin, et al. Composite Rod Optical Masers. Applied Optics. vol. 1, No. 1, Jan. 1962, pp. 11–15.

S. P. Timoshenko, et al. Theory of Elasticity. Third Edition. International Student Edition. Mc–Graw–Hill International Book Company, pp. 39–40, 1991. (No month).

Tracy S. Kubo, et al. Diode–Pumped Lasers at Five Eye–Safe Wavelenghts. IEEE J. of Quantum electronics. vol. 28, No. 4, Apr. 1992. pp. 1033–1040.

Steve C. Tidwell, et al. Scaling CW Diode–End–Pumped ND:YAG Lasers to High Average Powers. IEEE J. of Quantum Electronics, vol. 28, No. 4, Apr. 1992. pp. 997–1009.

S. R. Bowman, et al. Power Scaling of Diode–Pumped 2–Micron Lasers, LEOS '93. Nov. 15–18, 1993. 34 pgs.

H. C. Lee, et al. Single Crystal Composites for EO Applications, Optics in Montana '91: Topical Meeting on CTH:YAG. vol. 1. Aug. 13–15, 1991. 12 pgs.

McLellan, G. W. Glass Engineering Handbook. Third Edition, pp. 1–1 to 1–3 and 4–4 to 4–11. 1991, (No month).

H. C. Lee, et al. Diffusion Bonded Composites of YAG Single Crystals. SPIE, vol. 1624, 1991. Laser–Induced Damage in Optical Materials. pp. 2–10. (No month).

SOLID STATE LASERS WITH COMPOSITE CRYSTAL OR GLASS COMPONENTS

This is a Continuation-in-Part of application Ser. No. 08/339,147, filed Nov. 14, 1994, U.S. Pat. No. 5,563,899 which is a Continuation-in-Part of application Ser. No. 08/330,174, filed Oct. 27, 1994, now abandoned which is a Divisional of application Ser. No. 07/919,374, now U.S. Pat. No. 5,441,803 filed Jul. 29, 1992, which is a Continuation of application Ser. No. 07/672,251, filed Mar. 20, 1991, now abandoned which is a Continuation-in-Part of application Ser. No. 07/597,987, filed Oct. 15, 1990, now abandoned which is a Continuation of application Ser. No. 07/446,214, filed Dec. 5, 1989, now abandoned which is a Divisional of application Ser. No. 07/238,563, filed Aug. 30, 1988 now abandoned.

BACKGROUND OF THE INVENTION

This invention relates generally to solid state laser oscillators and amplifiers and more particularly to laserable rods, slabs or other configurations where thermal effects, parasitic oscillations and/or ground state absorption cause a degradation in lasing efficiency and/or beam quality. The improvement in lasing efficiency is achieved by attaching one or more nonlasing sections essentially parallel to the direction of beam propagation in a laser-active component which is irradiated with a source of pump energy. In some instances, additional performance improvements may be achieved by further attaching undoped or differently doped end sections.

Solid state laser sources have gained commercial acceptance over other types of lasers which are based on lasing transitions resulting from excited energy levels of gases or liquid organic dyes. They are increasingly preferred for commercial and defense applications because they are more compact, reliable, safe and economical to operate than competitive schemes. Solid state lasing media consist of crystalline or vitreous hosts containing one or more laser-active paramagnetic ions.

Many applications of solid state lasers such as materials processing, laser detection, and ranging require either high continuous wave (i.e., CW) output, high pulse energy or high pulse repetition rates. Since only a percentage of the applied pump energy is converted into useful laser radiation, a portion of the remaining energy is transferred into such competing mechanisms as radiationless transitions and absorption by the host lattice resulting in nonuniform heating of the laserable medium. To counteract the thermal effects generated by the pump radiation, laser media have to be cooled during operation. However, the ensuing nonuniform temperature distribution still places a serious constraint on the maximum output energy, repetition rates and beam quality.

Another competing mechanism to lasing results from internal reflections within a laserable medium. Internal reflections can greatly contribute to setting upper limits to achievable output powers. The long path lengths associated with internal reflections cause amplified spontaneous emission, thereby reducing the population inversion and thus lasing efficiency and maximum output power. Therefore, these lasing modes are called parasitic oscillations. One of these modes in laser rods is known as the whispering gallery mode. It propagates circumferentially in a laser rod with a polished outside barrel surface and depletes the inverted population in the laser-active medium as deep as $r=R/n$, where n is its refractive index, R=the radius of the rod and r is the nondepleted region in the laser rod. One method of counteracting this loss mechanism is to roughen the cylindrical surface of the rod to eliminate these reflections. Unfortunately, roughening the cylindrical surface results in a lowered pump efficiency due to scatter losses as well as causing a severe degradation in the tensile fracture strength of the rod. Depending on specific geometries, other highly detrimental modes of parasitic oscillations occur in rods and slabs.

G. E. Devlin et al. (Applied Optics, Vol. 1 (1) 11 (1962)) have recognized the benefits of laser rods which consist of cladding a cylindrical lasing core with a laser-inactive concentric sleeve. It appears, however, that these benefits were never realized with crystalline laser-active media due to the exceedingly difficult task of producing concentric cylinders of composite crystalline laser rods. Although a few concentric rods with a ruby core and sapphire cladding may have been fabricated using a fusion or melt cladding process, to our knowledge no such composite has been described in a scientific journal. These fabrication techniques pose severe limitations on the types of achievable configurations. Furthermore, the interface region between the laser-inactive cladding and the laser-active core is about a millimeter thick and exhibits striations which puts the lasing core under stress and adversely affects beam quality. It is also limited to components with round cross sections because the cylindrical lasing medium rotates during the crystal growing process. This type of structure is necessarily limited to core diameters which are larger than about 1–2 millimeters.

Glass forming technology is sufficiently advanced to allow the fabrication of concentric cylinders as described by R. F. Woodcock in U.S. Pat. Nos. 3,590,004 and 3,755,757, and by R. J. Landry et al. in U.S. Pat. 3,675,155. While this configuration is achievable by redrawing concentric glass preforms at relatively high viscosities under the influence of large forces, the process does not lend itself to readily fabricating claddings and cores of differing compositions since the materials must be well coordinated in thermal expansion coefficients as well as viscosity versus temperature relationships. Furthermore, glasses have to be of good optical quality which is only achievable by large and expensive melts. All of these constraints make the process rather impractical with the exception of drawing clad optical fibers from concentric cylinders. In this specific instance, large lengths of thin optical fibers may be drawn from concentric cylindrical preforms. This process does not lend itself to the fabrication of clad glass slabs which are also of commercial interest.

From the foregoing, it is apparent that a means of attaching undoped end sections to laser rods, slabs, nonplanar ring lasers and laser-active media of other configurations while maintaining good thermal uniformity, beam quality and lasing efficiency is desirable.

SUMMARY OF THE INVENTION

The thermal uniformity, beam quality and lasing efficiency of composite solid state lasers is improved by reducing parasitic oscillations and confining the laserable medium to a location in the composite laser component where it is most efficient. This improvement is accomplished by bonding one or more laser-inactive or laser-radiation-absorbing layers to a laserable medium.

Copending application Ser. No. 08/339,147, incorporated in its entirety for all purposes, discloses laser-active end sections which may be bonded to any of the configurations of the present invention. Alternatively, laser-active end sections consisting, for example, of laser radiation-absorbing and bleachable material may be bonded to at least one of the ends. As a further option, all cladding layers may consist of a material which is laser-active at a different wavelength than the one at which laser radiation is to be generated as output from the solid state laser device. This option allows laser pumping the laseractive material at a specific wavelength to further increase efficiency and reduce waste heat.

The bond between laserable and laser-inactive medium is created without the use of any inorganic or organic adhesive means. It is only due to intermolecular attractive forces between precision polished surfaces which are optically contacted and subsequently heat treated to strengthen the bond to an extent that it withstands laser operating conditions. Diffusion at the interface may occur but is not required to reach a bond strength which is sufficient to allow subsequent processing such as cutting, grinding, polishing and deposition of optical coatings.

Optical contacting, as utilized in the present invention, requires that no interferometric fringes be visible by the unaided eye at the optically contacted interface. If any interferometric fringes remain, for example due to defects at the optical interface, the resultant devices would be inferior and possibly useless. Therefore defects such as scratches and digs must be kept to a minimum.

Although the interface surfaces need not be flat, they must be complementary. Thus, for example, if one surface is concave, the mating surface must be convex with an equivalent figure. As an example of the desired surface figure characteristics, if the surfaces to be bonded are flat, they typically should be optically flat to at least one wavelength of visible light. The requirements for surface figure are dependent, to a degree, upon the aspect ratio of the parts to be bonded.

In one embodiment of the invention, one or more laser-inactive cladding layers are bonded to a laser-active medium essentially parallel to the long dimension of the component and to the direction of propagation of the laser radiation. The refractive index of the laser-active medium may be the same or higher than the laser-inactive medium. The laser-inactive medium serves as a physical support as well as a heat sink for the laserable medium.

In another embodiment, a composite consisting of a laserable medium is sandwiched between two layers of laser-inactive material. Laser radiation propagates essentially parallel to the two interfaces which are low in scatter and optically flat to within about 1 wavelength of visible light, depending on physical dimensions.

In yet another embodiment, a composite configuration consisting of a core of laserable material of polygonal cross section, e.g. triangular, square, rectangular, pentagonal, hexagonal or octagonal, is surrounded by a laser-inactive cladding material of the same or lower refractive index as the core material. The cross section of the outside of the composite may be shaped as required for introducing pumplight to the lasing medium and/or for mounting into a laser cavity. By way of example, the composite may be shaped as a cylindrical rod or with a square cross section.

In yet another embodiment, a composite in the shape of a slab is formed with at least two cladding layers sandwiching the laserable medium. The cladding layers may consist of laser-inactive material. Alternatively, the cladding layers may consist of a material which may be induced to lasing at a different wavelength which can be employed for laser pumping the sandwiched laserable medium.

In yet another embodiment, a composite is formed consisting of a one or two-dimensional array of laser-active material separated by laser-inactive material of the same or lower refractive index. The individual cores of laser-active medium may be square or rectangular in cross section.

A further understanding of the nature and advantages of the present invention may be realized by reference to the remaining portions of the specification and the drawings.

DESCRIPTION OF THE PREFERRED EMBODIMENT

Composite Formation Techniques

Two steps are common to the formation of any composite by the method of the present invention; optical contacting and heating the optically contacted composite. Although the term optical contacting is often used incorrectly to describe a variety of contacting procedures, as applied to the present invention optical contacting is characterized by the complete absence of interferometric fringes at the optically contacted interface as discerned by the unaided eye. Thus optical contacting implies that there are no areas at the interface which contain gaseous or solid inclusions since such inclusions would prevent the disappearance of interference fringes in the vicinity of the inclusion. Optical contacting is therefore a necessary condition for obtaining interfaces between two surfaces which are essentially free of defects.

Figure 1A:
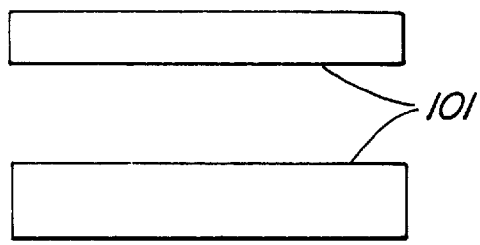
FIGS. 1A–C schematically illustrate the sequence of steps required to form a composite according to the present invention.
Figure 1B:
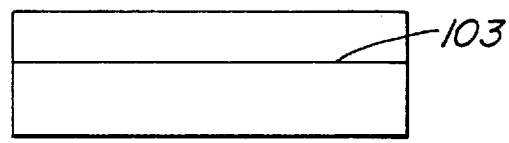
Figure 1C:
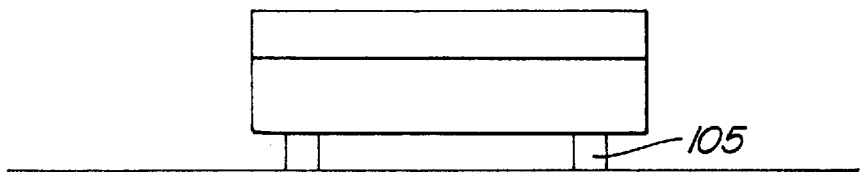

FIGS. 1A–C schematically illustrate the method of the present invention. In FIG. 1A two optically polished surfaces 101 are brought into juxtaposition while FIG. 1B illustrates the two surfaces being placed in optical contact at an interface 103. If optical contact is not established as evidenced by the disappearance of visible interference fringes at the interface, the composite is rejected. Typically rejected composites can be separated, undergo further preparation, and be reassembled. This process must be repeated until optical contact has been established and no defects remain at the interface.

In preparing the surfaces for optical contacting, the surfaces are polished using conventional grinding and polishing techniques. Although the present invention is equally applicable to flat and non-flat surfaces, it is critical that the figure of the two surfaces substantially match and that each of the surfaces has been adequately polished. Ultimately, if the surfaces are properly matched and have been sufficiently polished, optical contact can be achieved.

As an example of the requirements on surface figure, if the two surfaces to be bonded are flat, typically the flatness must be on the order of one wave of visible light for every 5 to 10 centimeters of surface. This requirement, however, varies with the aspect ratio of the components to be bonded. For example, if one of the components is extremely thin, it will tend to deform to a small degree in order to match the surface of the complimentary component. If, on the other hand, both components are quite thick, it is unlikely that either component will undergo measurable deformation. Thus the figure requirement for the thin component is not as stringent as that imposed on the thick component.

If desired, prior to optical contacting one or both surfaces may be optically coated with reflection, anti-reflection, polarizer, or other specialized coatings.

After optical contacting of the two components has been achieved, the optically contacted composite is subjected to a heat treatment as illustrated in FIG. 1C. In FIG. 1C the composite rests on a pair of support surfaces 105 during heat treatment. The support surface or surfaces may consist of any of a number of different materials; for example, graphite, polycrystalline ceramic, or fused silica. Further, the support may be coated with a release agent. It is important, however, that the support structure neither adhere to nor react with the composite. Furthermore the support structure should not react with the furnace, thereby resulting in contamination.

Although for many composites the heat treatment step can be performed under ambient conditions, some composites may require a specialized environment during processing due to cleanliness requirements or the reactivity of the individual components. Therefore if necessary this step may be performed in a clean room, in a vacuum, in a gas-filled glove box where the gas is an inert gas or some other non-reactive gas, or in another form of specialized environment.

Once the optically contacted assembly has undergone proper heat treatment, it acquires a bond strength and resistance to bond reversal which is greater than that of the untreated assembly. The extent of heat treatment depends on the intended use and the materials forming the composite. Typically a minimum heat treatment temperature of 80° C. is necessary. This level of heat treatment is sufficient for many electro-optic applications. The maximum temperature of heat treatment must remain within the range of the physical and/or crystallographic stability of the materials to be bonded.

For glass-containing composites, the heat treatment temperature should generally not exceed the glass transformation temperature of any component within the composite by more than 1.3 times. At these temperatures the risk of distortion is minimized as is the chance of a side reaction such as devitrification. For crystalline or polycrystalline materials, the maximum heat treatment temperature should generally not exceed 0.9 times the melting temperature of any component within the composite. Melting is not required for bond formation. Heat treatment at lower temperatures causes diffusion of gaseous species, mainly water vapor, at the interface between the two bodies. Some inter-diffusion between species of adjacent surfaces will occur at more elevated temperatures. These species may be vacancy sites, oxygen ions, or possibly cations. The theoretical mechanism of bonding is not critical for the present invention and is in fact not completely understood and is believed to vary for different substances. It is essential that heat treatment temperatures are not raised to a level which causes defects at the interface, e.g. by recrystallization, or beyond the physical stability of the materials of the construct.

The length of time required for heat treatment varies depending upon such factors as the materials to be bonded, the size of the bond interface, the heat treatment/bonding temperature, and the desired application. Typically a heat treatment period on the order of 8 to 50 hours is desirable, although shorter or longer periods may be necessary depending upon the specific application.

The rate at which the heat treated composite may be cooled back to room temperature depends on the materials characteristics of the components. For glass-containing substances, a specific annealing cycle has to be followed depending on the size of the composite structure, as is known in the art of glass annealing. Some crystals require a specific annealing rate to reduce stress while others may be cooled as fast as their thermal shock resistance allows.

The orientation of the composite during heat treatment is not limited to horizontal interface positions. In fact, generally interfaces may be oriented at any angle during heat treatment.

Composite Laser Embodiments

The ability to form composites between laser-active and laser-inactive materials has a wide range of applications for solid state lasers and opens design options which have not been available utilizing previously known fabrication techniques. Therefore, useful configurations become achievable with the laser-active and/or inactive components having dimensions between the largest sizes of available crystals down to thicknesses of the order of micrometers. FIGS. 2–9 illustrate a variety of generic designs of composite laser devices utilizing the present invention.

The laserable material may contain one or more laser-active ions evenly distributed in its crystal host lattice or glass host structure. The laser-active ions are typically selected from the group of 3d and/or 4f transition metal ions. The most preferred of these are $Cr^{3+}$, $Cr^{4+}$, $Nd^{3+}$, $Yb^{3+}$, $Er^{3+}$, $Tm^{3+}$, $Ho^{3+}$, $Ce^{3+}$, and $Pr^{3+}$.

Any crystalline or amorphous material which has previously been found suitable as a host lattice for laser-active ions can be used as laserable material in the present invention. In one embodiment of the invention, the laserable material is bonded to one or more layers of the same host material without the laser-active ion. In an alternate embodiment, the laserable material may be bonded to the same host material but containing a different concentration of the same laser-active ion or doped with a different laser-active ion. Alternatively, the laserable material may be bonded to a different host material.

Preferably, the crystalline materials are selected from single crystals of artificially grown garnets such as yttrium aluminum garnet (YAG), gadolinium gallium garnet (GGG), sapphire, yttrium aluminate (YALO), yttrium orthovanadate, yttrium orthosilicate, and fluoride crystals such as lithium yttrium tetrafluoride (YLF) and lithium strontium aluminum hexafluoride (LiSAF). Preferably the vitreous laser host materials are phosphate glasses.

Figure 2:
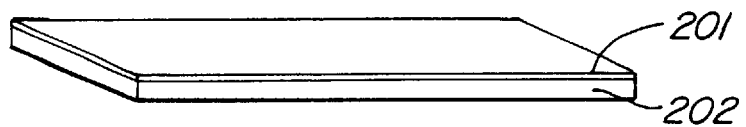
FIG. 2 is an illustration of a waveguide laser component consisting of a top layer of laser-active material bonded to a support layer of laser-inactive material.

FIG. 2 illustrates a waveguide laser component consisting of a thin layer of a laser-active material 201 bonded to a support layer of laser-inactive material 202. For example, material 201 may be a single crystal of 1 atomic percent Nd$^{3+}$:GGG and material 202 may be a section of undoped YAG. In this specific configuration and example, both materials 201 and 202 have dimensions of 6 millimeters wide by 11 millimeters long by 3 millimeters thick. The surfaces to be bonded are precision polished by conventional methods to a laser-quality polish without any scratches or digs visible at 40 times magnification and 150 watts illumination and to a surface figure of about 1/10 wave of visible light as determined by interference fringes with a test plate. The two crystals are precision cleaned and subsequently optically contacted in a clean environment at room temperature. If the surfaces have been adequately prepared and have been successfully optically contacted, no interference fringes and no defects can be observed when the interface between them is examined in a darkened room with a 150 watt focused lamp.

After successful optical contacting, the composite crystal of Nd:GGG and undoped YAG is placed in a furnace and gradually heated to 600° C., kept at this temperature for 16 hours and again gradually cooled to room temperature. For a composite of this size, typical heating and cooling rates are on the order of 50° to 100° C. per hour. Larger composites generally require slower rates to insure that the materials do not undergo thermal shock. The bond between the two crystals is now sufficiently strong that it may withstand any common fabrication processes. The two components are assumed to be bonded only by molecular attraction without any diffusion between the bulk of the crystals.

The two side faces of the 6 by 11 millimeter composite are precision polished to about 1 wavelength flatness, reducing the width of the composite crystal to 5 millimeters and removing any chamfers and chips at the bond line. The interface between the two crystal components shows a Fresnel reflection at the undoped YAG interface which is due to the difference in refractive index between Nd:GGG and YAG. Thereafter, the Nd:GGG crystal component is surface milled parallel to the interface to a thickness of about 0.5 millimeters, fine ground gradually to about 0.06 millimeters and polished to 0.05 millimeters. Then, the two end faces of the composite waveguiding structure are precision polished parallel to each other within 10 arc seconds and perpendicular to the 0.05 millimeters thick sides to result in a device length of 10 millimeters. Appropriate optical coatings are deposited for side pumping with a laser diode array of 10 millimeters length and for lasing perpendicular to the 3.05×5 millimeters end faces. The composite configuration acts as laser waveguide due to the difference in refractive index between Nd:GGG and YAG.

In another embodiment utilizing the configuration illustrated in FIG. 2, a 0.1 millimeter thick layer of single crystal KNbO$_3$ is bonded to a substrate of LiNbO$_3$. This device is employed for frequency doubling of 946 nanometer laser radiation generated from the radiative transition between the $^4F_{3/2} \rightarrow ^4I_{15/2}$ levels of Nd:YAG to blue laser radiation at 473 nanometers.

Figure 3:
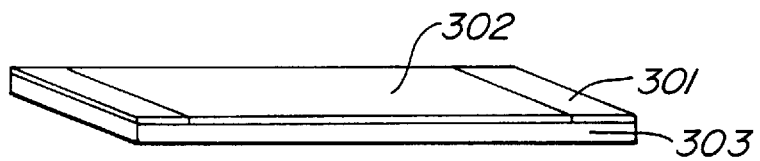
FIG. 3 is an illustration of a waveguiding structure consisting of a laserable material bonded to two undoped end sections, the three piece composite also being bonded to a support substrate.

FIG. 3 is an illustration of a waveguiding structure analogous to that illustrated in FIG. 2. Prior to final fabrication, this structure consists of a pair of undoped GGG end components 301 measuring 6 millimeters by 3 millimeters by 3 millimeters, a central Nd:GGG section 302 measuring 6 millimeters by 3 millimeters by 11 millimeters, and a YAG substrate 303 measuring 6 millimeters by 3 millimeters by 17 millimeters. To fabricate this structure undoped GGG sections 301 are first bonded to Nd:GGG section 302. Next the composite of sections 301 and section 302 are bonded to YAG substrate 303, forming a 6×17 millimeter interface. The remaining finishing steps are as described in the previous example. The undoped GGG end sections result in improved thermal uniformity and allow end pumping at higher average power without deteriorating the optical coatings at the end faces because the pump radiation is only absorbed in the doped Nd:GGG section which is not co-located with the position of the optical coating.

The configuration illustrated in FIG. 3 is not restricted to crystals bonded to each other. Equally useful as a waveguiding structure is a combination of a doped YAG layer with two undoped YAG ends, bonded to an optical glass of lower refractive index. A specific example of this configuration is an Er:YAG crystal of 5 millimeters by 0.05 millimeters by 10 millimeters bonded to two undoped YAG ends of 5 millimeters by 0.05 millimeters by 3 millimeters, resulting in two 5 millimeter by 0.05 millimeter interfaces. This composite is bonded to a heavy crown optical glass substrate, formed of a material such as SK50 produced by Schott Glass Technologies, with dimensions of 5 millimeters by 1 millimeters 16 millimeters. A composite of this nature is especially useful for side pumping and results in laser radiation at 2.94 micrometers.

Figure 4:
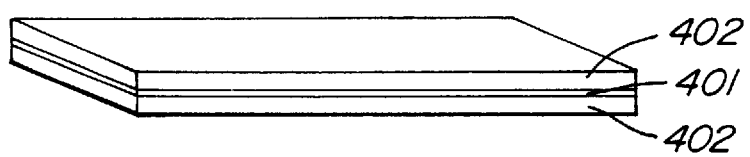
FIG. 4 is an illustration of a structure in which doped laser-active material is sandwiched between two laser inactive materials.

FIG. 4 illustrates a structure where the doped laser-active material 401 is sandwiched between two laser-inactive materials 402. Alternatively, layers 402 may consist of differently doped crystals which may be employed for laser-pumping the central layer.

Pure artificially grown sapphire is an especially desirable substrate crystal for waveguiding structures since its high thermal conductivity allows its use as a heat sink and enables the operation of solid state lasers at higher than average powers. Sandwich structures of sapphire with $Cr^{3+}$- or $Ti^{3+}$-doped sapphire allow concentration of pump light in the central layer and result in increased efficiency and improved beam quality.

A specific example of a waveguiding structure utilizing the configuration illustrated in FIG. 4 is a composite comprised of sapphire, Ti:sapphire, and sapphire crystals. To fabricate this composite, the surfaces to be bonded of two sapphire crystals and one Ti:sapphire crystal, each measuring 6 millimeters by 3 millimeters by 11 millimeters and with a crystallographic (0001) orientation perpendicular to the 3 millimeter by 11 millimeter faces, are precision polished to about 1/10 wavelength of visible light. One of the sapphire crystals and the Ti:sapphire crystal are optically contacted and heat treated to 700° C. for 16 hours. The Ti:sapphire surface of 6 millimeters by 11 millimeters is then surface milled and precision finished to a thickness of 0.5 millimeters and subsequently bonded to the second undoped sapphire crystal. The composite is carefully heat treated and annealed to obtain a composite of low stress. The resulting composite is finished to a final size of 2.5 millimeters by 5 millimeters by 10 millimeters with end faces at Brewster angles. The tunable composite Ti:Al$_2$O$_3$ demonstrates increased efficiency when pumped with the output of a laser-diode pumped frequency doubled Yb:YAG laser.

In an alternate configuration of the previous example, two 2 millimeter thick undoped Al$_2$O$_3$ end faces are bonded at Brewster angles to the ends of the sapphire/Ti:sapphire/sapphire composite. The undoped sapphire ends are finished at Brewster angles. This configuration achieves even higher output powers with excellent beam quality in the range of 700 to 1050 nanometers.

Another example of a waveguiding structure utilizing the configuration illustrated in FIG. 4 is a composite comprised of 50 atomic percent Er:GGG with two undoped GGG sections. The fabrication process is analogous to that described above.

Figure 5:
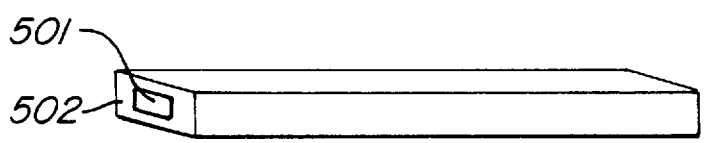
FIG. 5 is an illustration of a composite structure consisting of a core of laser-active material of rectangular cross section clad with laser-inactive material.

FIG. 5 is an illustration of a composite structure according to the present invention which has a core of laser-active material 501 surrounded by a laser-inactive material 502. The cross section of the core may be triangular, square, rectangular or any other polygonal shape. The outside cross section of the composite may be polygonal or circular. Undoped ends may be bonded to the composite to achieve additional benefits of thermal uniformity and improved beam quality as illustrated in FIG. 6.

A specific example of a composite utilizing the configuration illustrated in FIG. 5 is a Nd:YAG core measuring 1 millimeter by 1 millimeter by 10 millimeter surrounded by and undoped YAG cladding. The overall dimensions of the resultant composite is 3 millimeters by 3 millimeters by 10 millimeters. The fabrication of this particular composite requires four bonding steps. Starting crystals which are each oversized by 1 to 2 millimeters in every dimension are all precision polished on the surfaces which are to be bonded. The Nd:YAG crystal is then bonded with one of the prepared undoped YAG crystals. After this first bonding step, the Nd:YAG component is reduced in thickness to 1 millimeter by precision milling, fine grinding, and polishing, and then again bonded to an undoped YAG crystal to form a sandwich structure. The third and forth bonding steps are performed perpendicular to tho first two interfaces, reducing the dimensions of the core to 1 millimeter by 1 millimeter in cross section. Then, the sides of the composite are finished by inspection polishing. The end faces are precision polished to a laser finish and optically coated. Alternatively, the outside may be finished as cylindrical rod or any other shape which is useful for a specific lasing device.

Figure 6:
FIG. 6 is an illustration of a rod-shaped composite construct consisting of a core of laserable material of square cross section clad with laser-inactive material and with laser-inactive end sections attached to each side.

FIG. 6 is an illustration of a composite laser component for solid state lasers where the doped core 601 is clad with undoped material 602 and also has undoped end sections 603 affixed to it by the bonding process of the present invention. Specifically, a composite according to this configuration may be fabricated with a $Nd^{3+}$:YAG core measuring 1 millimeter by 1 millimeter by 10 millimeters, clad with undoped YAG and with undoped YAG ends bonded to it. After fabrication the composite rod measures 3 millimeters in diameter by 18 millimeters in length. The composite rod is end pumped with laser diode radiation and emits laser radiation at 946 nanometers.

Figure 7:
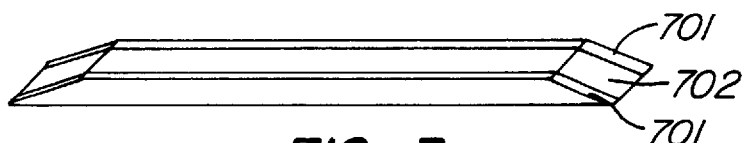
FIG. 7 is an illustration of a composite slab design with one cladding layer bonded to each long side face parallel to the direction of laser beam propagation.

FIG. 7 is an illustration of a composite laser slab which has two cladding layers 701 of undoped material bonded to a lasing medium 702 to greatly reduce losses due to parasitic oscillations.

Figure 8:
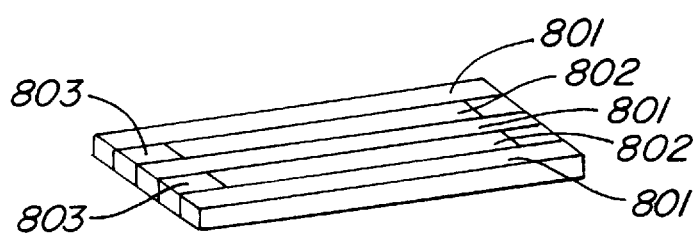
FIG. 8 is an illustration of a composite slab consisting of a linear array of five components with alternating laser-inactive and laser-active media.

FIG. 8 is an illustration of a linear waveguide array consisting of alternating layers of undoped sections 801 and doped sections 802. The laser output of each doped section may be controlled separately to shape a desired beam profile for a specific application such as materials machining or surgery. Undoped end sections 803 may be bonded to the doped sections 802.

In a specific example of a composite utilizing the configuration illustrated in FIG. 8, a 4 atomic percent Tm:YAG material is bonded to undoped YAG end sections with alternating layers of undoped sapphire. The crystallographic orientation of the (0001) direction of the sapphire crystals is parallel to the long axis of the composite. The Tm:YAG crystals are oriented with their (111) axis parallel to the long axis.

To fabricate the composite undoped end sections 803 of YAG are first bonded to the two Tm:YAG crystals 802, resulting in a pair of composite doped/undoped YAG rods. The Tm:YAG crystals are 18 millimeters long and the undoped ends are each 3.5 millimeters long. The bonding steps are performed utilizing the techniques of the previous examples. Three sapphire crystals 801 and the two composite Tm:YAG crystals, each measuring 3 millimeters by 4 millimeters by 25 millimeters, are precision polished on their 4 millimeter by 25 millimeter surfaces. Two composites each of a sapphire/Tm:YAG doublet are produced in a first bonding step and heat treated to 500° C. for 16 hours. The thickness of the Tm:YAG crystal of one of them is reduced to 0.40 millimeters by surface milling, fine grinding and precision polishing, resulting in a bondable surface of 4 millimeters by 25 millimeters parallel to the existing interface. Similarly, the thickness of the sapphire side of the second doublet is reduced to a thickness of 0.2 millimeters parallel to the existing interface and finished to a bondable surface quality. The two doublets are then bonded together, resulting in a quadruplet. The Tm:YAG side is thereafter finished to a thickness of 0.40 millimeters with a bondable surface finish according to the present invention. The quadruplet is subsequently bonded with the third sapphire component, resulting in a five-layer composite. The outside sapphire layers are thinned to 0.2 millimeters parallel to the interface, resulting in a 1.4 millimeter by 4 millimeter by 25 millimeter 5 layer composite. The composite is cut parallel to the 1.4 millimeter by 25 millimeter surface into two equal parts which are finished to yield two composites of 1.4 millimeter by 1.0 millimeters by 23 millimeters each.

Similarly, longer arrays of laser-active and inactive materials may be produced by starting with the appropriate number of doublets and repeating the bonding process. By way of example, repeating the bonding process N times where N equals 4, a composite with $2^N$ or 16 layers may be obtained while insuring the defect-free quality of each individual interface.

Figure 9:
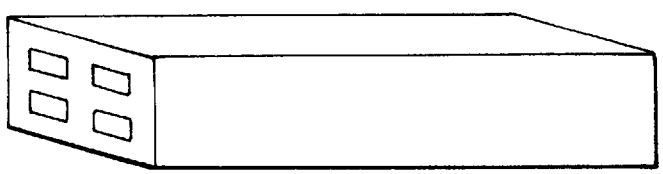
FIG. 9 is an illustration of a 2-dimensional 2×2 array of laser-active cores embedded in laser-inactive material.

FIG. 9 is an illustration of a 2-dimensional composite array of laser-active and laser-inactive materials. The number of array elements may be much larger than illustrated, for example 2×8 or 2×16 arrays. They are produced analogously to the procedure described in the previous example.

While the present invention is most readily applicable to flat interfaces due to the relative simplicity of fabricating precision polished flat surfaces, the invented methods of bonding are applicable to any other precision polished surfaces. However, the requirement for optical contact is the same regardless of whether the surfaces are flat or non-flat. As previously described, optical contact between two surfaces is achieved when no interference fringes over the entire contacted interface are visible with the unaided eye. In the most general case, the invention is amenable to bonding matching rotationally symmetric or non-rotationally symmetric aspheric precision surfaces. Plano, spherical, elliptical, cylindrical and conical surfaces are specific examples. Non-plano surfaces afford much more latitude in the design of electro-optic and opto-electronic systems, and often permit substantial savings in the overall system costs although the fabrication of the individual components is usually more expensive than that of plano surfaces. By way of example, spherical or cylindrical interfaces allow the combination of optical functions such as focusing of pump radiation and beam corrections with critical laser properties such as improved thermal uniformity and avoidance of ground state absorption losses, generally resulting in more compact, efficient and lower cost systems.

While the invention has been described for certain embodiments, different configurations may be used. Different materials, dimensions, and heat treatment procedures may be made without departing from the spirit and scope of the invention as described in the following claims.

What is claimed is:

1. A solid state laser device, comprising:

an ionic lasing medium with a surface substantially parallel to an intended direction of propagation of generated laser radiation; and a non-lasing ionic medium optically contacted to said surface to form an essentially defect free interface, wherein said interface is permanently bonded using an adhesive-free diffusion bonding technique, wherein said non-lasing ionic medium is sapphire with a (0001) crystallographic plane aligned parallel to said surface.

2. A solid state laser device, comprising:

an ionic lasing medium with a surface substantially parallel to an intended direction of propagation of generated laser radiation; and a non-lasing ionic medium optically contacted to said surface to form an essentially defect free interface, wherein said interface is permanently bonded using an adhesive-free diffusion bonding technique, wherein said ionic lasing medium has a refractive index which is higher than that of said non-lasing medium.

3. A solid state laser device, comprising:

a core of an ionic lasing medium with a polygonal cross-section substantially perpendicular to an intended direction of propagation of generated laser radiation, said core having a plurality of surfaces substantially parallel to said intended propagation direction; and a cladding of laser-inactive material optically contacted to said plurality of surfaces to form a plurality of essentially defect free interfaces, wherein said plurality of interfaces are permanently bonded using an adhesive-free diffusion bonding technique.

4. The solid state laser device of claim 3, further comprising a first end section of laser-inactive material optically contacted to a first end surface of said core to form an essentially defect free end interface, wherein said end interface is permanently bonded using an adhesive-free diffusion bonding technique, and wherein said first end surface is substantially perpendicular to said intended propagation direction.

5. The solid state laser device of claim 4, further comprising a second end section of laser-inactive material optically contacted to a second end surface of said core to form a second essentially defect free end interface, wherein said second end interface is permanently bonded using an adhesive-free diffusion bonding technique, and wherein said second end surface is substantially perpendicular to said intended propagation direction.

6. A solid state laser array, comprising an alternating sequence of at least two ionic lasing layers and at least two laser-inactive layers optically contacted along adjacent surfaces to form a plurality of essentially defect free interfaces, wherein said plurality of interfaces are permanently bonded using an adhesive-free diffusion bonding technique, said plurality of interfaces substantially parallel to an intended direction of propagation of generated laser radiation.

7. The solid state laser array of claim 6, wherein said ionic lasing layers have a polygonal cross-section substantially perpendicular to said intended direction of propagation.

8. The solid state laser array of claim 6, wherein said alternating sequence has a first layer and a last layer, and wherein said first and last layers comprise laser-inactive layers.

9. The solid state laser array of claim 6, further comprising a first portion of non-lasing ionic medium optically contacted to a first end of each of said ionic lasing layers to form a plurality of essentially defect free end interfaces, wherein said plurality of end interfaces are perpendicular to said intended direction of propagation, and wherein said plurality of end interfaces are permanently bonded using an adhesive-free diffusion bonding technique.

10. The solid state laser array of claim 9, further comprising a second portion of non-lasing ionic medium optically contacted to a second end of each of said ionic lasing layers to form a second plurality of essentially defect free end interfaces, wherein said plurality of second end interfaces are perpendicular to said intended direction of propagation, and wherein said plurality of second end interfaces are permanently bonded using an adhesive-free diffusion bonding technique.

11. A solid state electro-optic device with an ionic single crystalline material optically contacted to a sapphire substrate to form an essentially defect free interface, wherein said interface is permanently bonded using an adhesive-free diffusion bonding technique, wherein said sapphire has a (0001) crystallographic plane aligned parallel to said interface.

* * * * *